| (12) | United States Patent<br>Benavides | (10) Patent No.: US 12,136,933 B2<br>(45) Date of Patent: Nov. 5, 2024 |
|---|---|---|

(54) DATA COMPRESSION VIA BINARY SUBSTITUTION

(71) Applicant: Anthony Ben Benavides, New Market, MD (US)

(72) Inventor: Anthony Ben Benavides, New Market, MD (US)

(73) Assignee: Anthony Benavides, New Market, MD (US)

( * ) Notice: Subject to any disclaimer, the term of this patent is extended or adjusted under 35 U.S.C. 154(b) by 0 days.

(21) Appl. No.: 18/471,178

(22) Filed: Sep. 20, 2023

(65) Prior Publication Data

US 2024/0088910 A1     Mar. 14, 2024

Related U.S. Application Data

(63) Continuation of application No. 15/731,813, filed on Aug. 7, 2017, now abandoned.

(60) Provisional application No. 62/495,056, filed on Sep. 1, 2016.

(51) Int. Cl.
    *H03M 7/40*     (2006.01)
    *H03M 7/04*     (2006.01)
    *H03M 7/30*     (2006.01)

(52) U.S. Cl.
    CPC ............... *H03M 7/04* (2013.01); *H03M 7/30* (2013.01); *H03M 7/55* (2013.01)

(58) Field of Classification Search
    CPC ............ H03M 7/04; H03M 7/30; H03M 7/55
    USPC ......................................................... 341/67
    See application file for complete search history.

(56) References Cited

U.S. PATENT DOCUMENTS

2009/0234642 A1* 9/2009 Mittal ................. H03M 7/30
    704/201

* cited by examiner

*Primary Examiner* — Jean B Jeanglaude

(57) ABSTRACT

Operations include obtaining a binary source data set and determining a decimal value that represents the source data set. In addition, the operations include determining a Kinetic Data Primer (KDP) that represents the decimal value. The KDP may include a mathematical expression that represents the decimal value. Further, the operations may include storing the KDP as a compressed version of the source data set.

9 Claims, 3 Drawing Sheets

300

{80th Bit>0001000100111100111001110101000010100111110100000000000011000100000001111111<1' Bit} 0

{64th Bit> 0001000011000011010110011101111001000001010001001101101110111011 <0 Bit}

FIG. 4

DATA COMPRESSION VIA BINARY SUBSTITUTION

CROSS-REFERENCE TO RELATED APPLICATIONS

This application claims priority to U.S. Application Ser. No. 15/731,813 filed Aug. 7, 2017, which claims priority to and the benefit of the U.S. Provisional Application No. U.S. 62/495,056, both of which are incorporated herein by reference in their entireties.

BACKGROUND

Since the advent of data compression science, there have been countless technologies, strategies, and novel techniques for compressing data that, regardless of their intended source application, can be categorized as either "lossless" or "lossy" techniques. LOSSY data compression techniques utilize many different strategies to create smaller output files by discarding (losing) a quantifiable amount of material information contained in the original source data. Conversely, LOSSLESS data compression is a class of data compression techniques and specific algorithms that allow all the original source data to be perfectly reconstructed from the compressed data. Lossless compression is used in cases where it is imperative that the original source data and the decompressed output data be identical. Typical examples of source data where maintaining data integrity would be preferable are software programs, text documents, and other machine-executable source code.

SUMMARY

Embodiments of the present disclosure relate to operations including obtaining a binary source data set and determining a decimal value that represents the source data set. In addition, the operations include determining a Kinetic Data Primer (KDP) that represents the decimal value. The KDP may include a mathematical expression that represents the decimal value. Further, the operations may include storing the KDP as a compressed version of the source data set.

BRIEF DESCRIPTION OF THE DRAWINGS

The present systems and methods for yield scenario encoding for autonomous systems are described in detail below with reference to the attached drawing figures, wherein:

FIG. 3 illustrates an example source data set, according to one or more embodiments of the present disclosure; and;

FIG. 4 illustrates another example source data set, according to one or more embodiments of the present disclosure.

DETAILED DESCRIPTION

Figure 1:
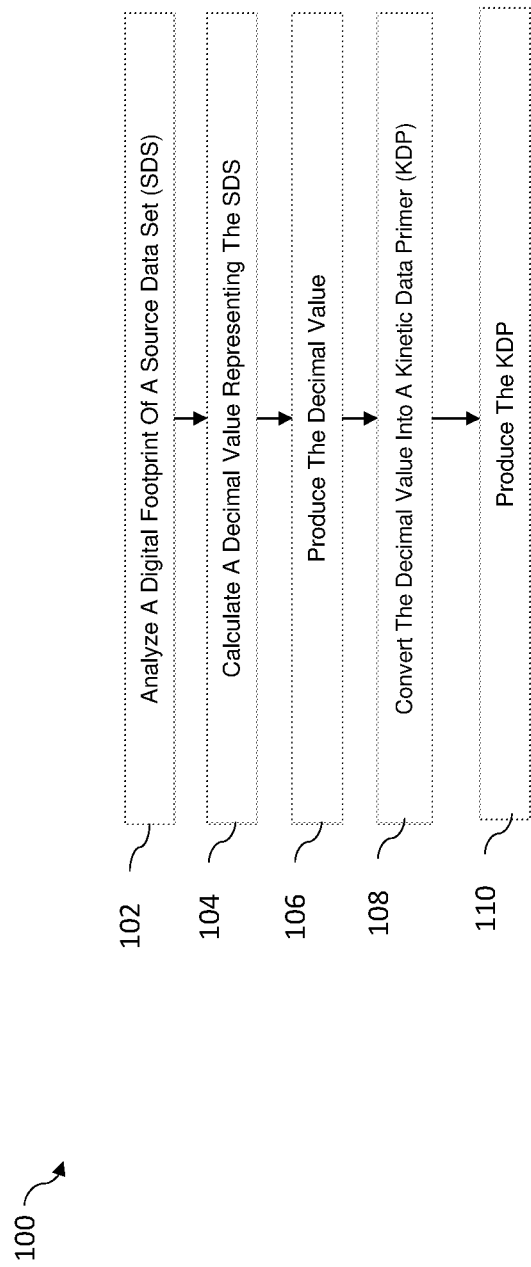
FIG. 1 illustrates an example method for compressing data, according to one or more embodiments of the present disclosure.

In the modern digital world, millions and billions of source bits are assembled to create most commonly used data sets like software programs, multimedia files, games, and digital communication signals. To increase the utility of digital data, there have been many innovations in the art of data compression that are based upon as many different strategies, frameworks, and methodologies as there are hardware and software systems that utilize such data. Most data compression techniques are based upon condensing source data by deleting a material amount of information or by substituting source data for an alternative symbolic representation.

Compressing data streams by calculating the value of its consecutive bits produces sums that can often be millions of digits in length. This is because according to the mathematical nature of adding the individual bits of an arbitrary-length binary data set, the numerical value of any given bit in a stream is exactly double the magnitude of the bit that directly precedes its position, and exactly one-half the magnitude of the bit that follows it.

Computers perform mathematical calculations by combining the logical operations performed by its logic gates to compute the necessary additions, subtractions, multiplications, etc., and arrive at a precise answer. The sequence of logical operations used to perform a particular calculation or specific predetermined functions are called algorithms. If computational resources are not a concern, calculating the numerical value of the assembled bits in a source data set and representing the combined sum in whole decimal value is trivial from an algorithmic perspective. Successively adding a data stream's bits that are initialized to zero (0) followed by the non-negative integer one (+1) up to N (if any) will compute $\{0, 1, 1+N \ldots N\}$, provided that the necessary computing functions do not exceed the limits of the available CPU hardware and the output decimal representation fits into an allocated memory source.

To explain how this process would apply to a real world paradigm, we will examine one of the most commonly encountered binary data sets of the modern computer age: the digital music file. Given that the average 4-minute music file (.MP3 song, for instance) is approximately 4.0 Megabytes ("MB") in size, this means that there are 4,194,304 bytes in the file. A byte is defined as a unit of computer information or extensible data storage capacity that consists of a discrete group of 8 bits and that is used especially to represent an alphanumeric character (i.e.: letters, numbers, symbols, etc.). Because a byte is made up of 8 bits, this means that a 4.0 MB music file contains 33,554,432 individually-assembled bits. When these 33 million bits are consecutively added together, this will mathematically produce an equivalent decimal sum approximately 10 million digits long.

In the realm of computer science, when these metrics are considered in terms of data compression, consecutively adding a data stream's bits in order to calculate the numerical value of the entire stream does not, in itself, produce any compression of the original size of the stream. Statistically speaking, a zero net compression ratio (1:1) is produced as a result of this basic process. In fact, in certain instances, negative compression ratios can result from converting binary values into their equivalent decimal values. The fundamental logic of the SBS scheme is to realize superior and absolutely lossless levels of compression by using dynamic mathematical utilities to express a data stream's combined decimal sum in its most elegant, precise, and highly-abbreviated form. By using robust math tools such as square and cube roots, high-powered exponentials, factorials, and other algebraic and calculus functions, the information contained within entire data streams, indeed oceans of data, can be flawlessly substituted for extremely compact and mathematically-precise "Kinetic Data Primers", (or "KDPs"). A KDP is, essentially, a basic set of mathematical instructions that, upon algorithmic calculation, is designed to yield precise decimal sums that can be easily converted into a linear sequence of equivalent-value binary bits.

To illustrate how calculating a data set's bits can produce extremely large decimal numbers, and how such numbers can be simply expressed as mathematically-perfect KDPs, the following illustration is a graphical interpretation of a relatively small 64-byte data set. For perspective, given that the size of a common text message (i.e.: a "tweet" on the Twitter service) is limited to 140 characters, which would require 140 bytes of uncompressed data to represent those characters, 64 bytes is roughly half that size:

For instance, below is an example binary data set that may be the same size as a 64-character text message:
11101011110100001110101111000011110101000101100110011011000100010100110101101 011010101101101010110011010111010101011110110101010110101111101110010100111101111001111011010111010110001110100010100011010110101010101010110011010101010101011110101010101111110101010100101010101010101011001100110100001011101010111010101010101010010111101110101010101010101010101010010101010100101011111010110101010101101011010101001010101011111100000101010100101011

When the numerical values of these bits are consecutively added together (as described in further detail in the present disclosure), they produce the following decimal sum:
13,407,807,929,942,597,099,574,024,998,205,846,127, 479,365,820,592,393,377,723,561,443,7 21,764,030, 073,546,976,801,874,298,166,903,427,690,031,858, 186,486,050,853,753,882,811,9 46,569,946, 433,649, 006,084,096

The above-decimal sum may be represented in a Scalable Binary Substitution ("SBS") format, can be precisely expressed as a Kinetic Data Primer ("KDP") as elegant and compact as: $2^{512}$ (Two-to-the-Five Hundred and twelfth-power).

Note that the example given with respect to the specific integer provided above is such that this specific integer represents the precise decimal sum produced by successively adding all 512 bits of a 64-byte binary data set, providing, of course, that each bit in the set yielded its maximum possible numerical value relative to its position within the set (e.g., if every bit in the data set were calculated as binary ones (1s)). Demonstrating the functionality of the SBS-KDP methodology by reducing a 155-digit integer into a numerically-equivalent (exponentially-powered) 5-character KDP is used herein only to show the maximum mathematically-achievable algorithmic efficiency of the SBS scheme by exploiting the structural stability of binary arithmetic to manipulate binary source data sets in proprietary ways.

In the case of the 4.0 MB music file mentioned herein, the 10 million-digit-long decimal number that is produced by successively adding its 33 million source bits can be profoundly reduced by expressing its numerical sum in a more elegant, yet mathematically-precise way. For example, the numerical value of a 10 million-digit-long decimal number can be accurately expressed as a KDP as compactly-written as:

"1560000^1560000"
(One million five hundred and sixty-thousand-to-the-One million five hundred sixty-thousandth-power)

When a Kinetic Data Primer of this magnitude is calculated, it will produce a decimal sum approximately 10 million digits in length. This 10 million-digit-long decimal number can then, in turn, be converted back into its precise binary equivalent which, in the methodology of the SBS substitution scheme, would serve to perfectly reconstruct the digital footprint (i.e.: bit type and exact position) of all 33 million bits in the original 4.0 MB source data set.

The ultimate utility of the SBS scheme can be found in the sheer economy of data used to substitute the exact numerical value of astronomically-large source-calculated sums: Encoding an arbitrary mathematical expression such as "1560000^1560000" into a machine-readable format would only require 50 bits of data (less than 7 bytes). In particular, the Kinetic Data Primer size variable of seven (7) bytes represents the 50 bits of data needed to encode the mathematical expression "1560000^1560000" into its KDP format. These 7 KDP bytes include the 21 bits of data needed to represent both the base decimal magnitude of (1,560,000) and its exponential power magnitude of $(1,560,000^{1560000})$, plus the 8 bits of data needed to represent the ASCII symbol (^) used to signify a base number's exponential value. The 50 bits of data needed to express the KDP "1560000^1560000", for example, can be encoded within 7 bytes because, at 8-bits-per-byte, the maximum data capacity of 7 bytes is 56 bits. This 7-byte KDP size variable excludes any proprietary KDP file data including, for instance, any SBS-KDP file ID, KDP codec decimal library markers, alphanumeric hash tags (MD5, etc.), IP security/encryption codes, forensic authentication data (DMCA, etc.), KDP mantissa-correction codes, and any other dynamic KDP payload data. When these extrinsic SBS-KDP file data are embedded into a KDP in its perfect format, this could increase the KDP's output size from its 7-byte "Quantum Footprint" to a maximum scalable payload capacity of 32 bytes (0.03 KB). When a KDP is scaled to its maximum payload size format of 32 bytes, this will necessarily decrease its output compression ratio from 599,186:1 to 131,072:1, which is the net compression yield of 4,194,304 bytes reduced to 7 bytes (0.007 KB) and 32 bytes (0.03 KB), respectively In general terms of data compression, encoding the binary information contained in a 4,194,304-byte (4.0 MB) source file into an SBS-KDP as infinitesimally compact as seven (7) bytes would mathematically indicate a baseline output compression ratio of 599,186:1, which is the net compression yield of 4,194,304 bytes reduced to 7 bytes (0.007 KB). For technical perspective, the current state-of-the-art in commercial-grade audio media compression techniques only produce average output compression ratios of less than 100:1.

The SBS Algorithm

FIG. 1 illustrates an example method 100 that illustrates specific functions of the SBS algorithm scheme. The method 100 may be performed by any suitable system, apparatus, or device, such as a computing system. The method 100 relates to performing data compression based on the SBS algorithm scheme.

The method 100 may include a block 102, at which the digital footprint of a Source Data Set (SDS) may be analyzed. At block 104, the numerical value representing the SDS's bits may be calculated (e.g., the decimal sum value of the SDS bits may be calculated). At block 106, the decimal value of the sum of the SDS may be produced. At block 108, the decimal sum may be converted into a (compactly expressed) KDP. At block 110, the KDP may be produced.

Figure 2:
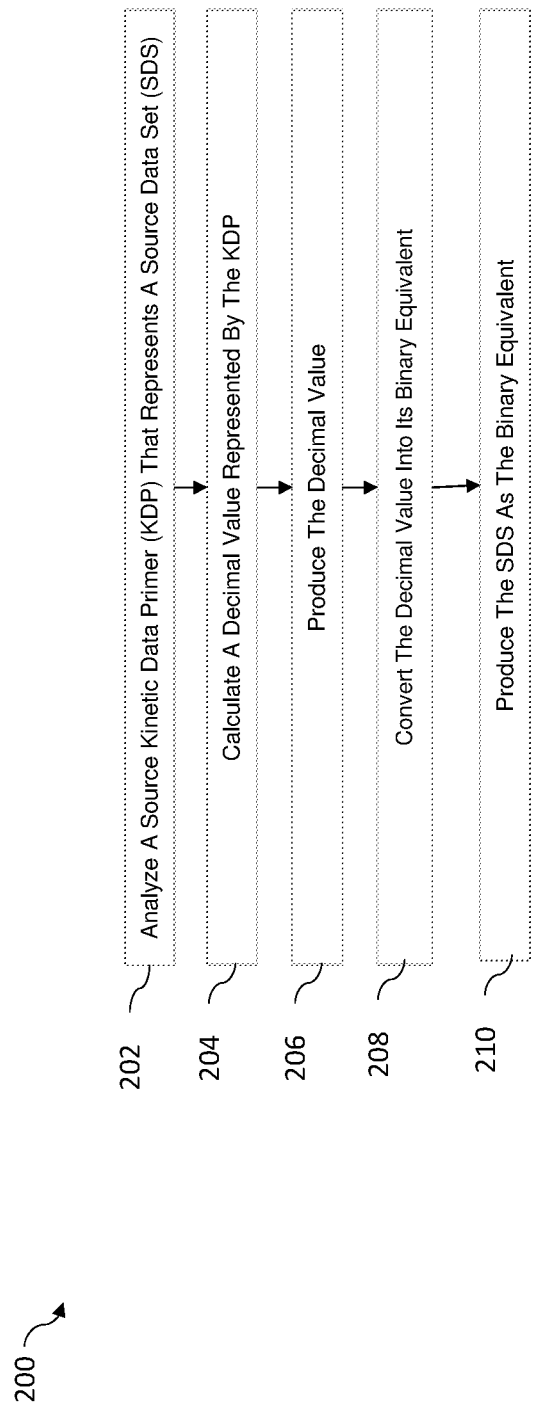
FIG. 2 illustrates an example method for decompressing data, according to one or more embodiments of the present disclosure.

FIG. 2 illustrates an example method 200 that illustrates specific functions of the SBS algorithm scheme. The method 200 may be performed by any suitable system, apparatus, or device, such as a computing system. The method 200 relates to performing data decompression based on the SBS algorithm scheme.

The method 200 may include a block 202, at which a source KDP representing an SDS may be analyzed. At block 204, the numerical decimal value represented by the KDP may be calculated. At block 206, the decimal value represented by the KDP (e.g., the decimal value of the sum of the SDS) may be produced. At block 208, the decimal sum may be converted into its binary equivalent (e.g., the binary values of the bits of the SDS may be determined based on the decimal sum). At block 210, a copy of the SDS may be produced as the determined binary equivalent.

The SBS Algorithm Scheme

An example illustration of the substitution methodology of the SBS algorithm scheme (e.g., the source bits-to-kinetic data primer) is as follows below with respect to an example binary source data set 300 (SDS 300) illustrated in FIG. 3A.

The SDS 300 of FIG. 3 includes 80 bits. Eighty bits (at 8 bits-per-byte) equals 10 bytes. Because a bit can only exist in two states, a zero (0) or a one (1), for the purposes of demonstrating the functionality of the SBS algorithm, the bits in the SDS have been randomly arranged. The numerical value of any given bit in a data set is determined by its type (i.e.: 0 or 1) and its exact position within the set. When calculating the numerical value of consecutive bits in any finite-length data set, it is important to note that only bits with a binary value of "1" produce any numerical value and their equivalent decimal values are determined by their exact position within the set. Conversely, if any bit in a finite-length data set has a binary value of "0", it will not produce any numerical value and, therefore, its equivalent decimal value is set at "0" regardless of its position within the data set. Additionally, since the numerical value of the first bit (bit-1) of any finite-length data set will always be initialized to zero (0), it will only produce a corresponding decimal value of one (+1) if it is a 1-bit. All subsequent bits in the data set, if any, will produce a corresponding decimal value exactly double (2×) the value of the bit that directly precedes its position. The potential decimal value of the bits in any finite-length data set of "N" bits is determined as follows, where the number in the exponent represents the placement of the corresponding bit starting with a placement value of "0" indicating the placement of the first bit:

$$\{2^0(1), 2^1(2), 2^2(4), 2^3(8), 2^4(16), 2^5(32), 2^6(64), 2^7(128), 2^8(256), 2^9(512), \ldots 2^{N-1}\}$$

As a further example, TABLE 1 below illustrates determined decimal values (bit values) for each of the bits of the SDS 300 of FIG. 3. TABLE 1 also includes a decimal sum value that may be obtained by summing the determined bit values for the SDS 300.

| Bit Number | Placement Value | Binary Value | Decimal Value |
|---|---|---|---|
| 1 | 0 | 1 | 1 |
| 2 | 1 | 1 | 2 |
| 3 | 2 | 1 | 4 |
| 4 | 3 | 1 | 8 |
| 5 | 4 | 1 | 16 |
| 6 | 5 | 1 | 32 |
| 7 | 6 | 1 | 64 |
| 8 | 7 | 1 | 128 |
| 9 | 8 | 0 | 0 |
| 10 | 9 | 0 | 0 |
| 11 | 10 | 0 | 0 |
| 12 | 11 | 0 | 0 |
| 13 | 12 | 0 | 0 |
| 14 | 13 | 0 | 0 |
| 15 | 14 | 1 | 16,384 |
| 16 | 15 | 0 | 0 |
| 17 | 16 | 0 | 0 |
| 18 | 17 | 0 | 0 |
| 19 | 18 | 0 | 0 |
| 20 | 19 | 1 | 524,288 |
| 21 | 20 | 1 | 1,048,576 |
| 22 | 21 | 0 | 0 |
| 23 | 22 | 0 | 0 |
| 24 | 23 | 0 | 0 |
| 25 | 24 | 0 | 0 |
| 26 | 25 | 0 | 0 |
| 27 | 26 | 0 | 0 |
| 28 | 27 | 0 | 0 |
| 29 | 28 | 0 | 0 |
| 30 | 29 | 0 | 0 |
| 31 | 30 | 0 | 0 |
| 32 | 31 | 0 | 0 |
| 33 | 32 | 0 | 0 |
| 34 | 33 | 1 | 8,589,934,592 |
| 35 | 34 | 0 | 0 |
| 36 | 35 | 1 | 34,359,738,368 |
| 37 | 36 | 1 | 68,719,476,736 |
| 38 | 37 | 1 | 137,438,953,472 |
| 39 | 38 | 1 | 274,877,906,944 |
| 40 | 39 | 1 | 549,755,813,888 |
| 41 | 40 | 0 | 0 |
| 42 | 41 | 0 | 0 |
| 43 | 42 | 1 | 4,398,046,511,104 |
| 44 | 43 | 1 | 8,796,093,022,208 |
| 45 | 44 | 1 | 17,592,186,044,416 |
| 46 | 45 | 1 | 35,184,372,088,832 |
| 47 | 46 | 0 | 0 |
| 48 | 47 | 0 | 0 |
| 49 | 48 | 1 | 281,474,976,710,656 |
| 50 | 49 | 0 | 0 |
| 51 | 50 | 1 | 1,125,899,906,842,624 |
| 52 | 51 | 0 | 0 |
| 53 | 52 | 1 | 4,503,599,627,370,496 |
| 54 | 53 | 0 | 0 |
| 55 | 54 | 0 | 0 |
| 56 | 55 | 0 | 0 |
| 57 | 56 | 0 | 0 |
| 58 | 57 | 1 | 144,115,188,075,855,872 |
| 59 | 58 | 0 | 0 |
| 60 | 59 | 1 | 576,460,752,303,423,488 |
| 61 | 60 | 1 | 1,152,921,504,606,846,976 |
| 62 | 61 | 0 | 0 |
| 63 | 62 | 1 | 4,611,686,018,427,387,904 |
| 64 | 63 | 1 | 9,223,372,036,854,775,808 |
| 65 | 64 | 0 | 0 |
| 66 | 65 | 0 | 0 |
| 67 | 66 | 1 | 73,786,976,294,838,206,464 |
| 68 | 67 | 1 | 147,573,952,589,676,412,928 |
| 69 | 68 | 1 | 295,147,905,179,352,825,856 |
| 70 | 69 | 1 | 590,295,810,358,705,651,712 |
| 71 | 70 | 0 | 0 |
| 72 | 71 | 0 | 0 |
| 73 | 72 | 1 | 4,722,366,482,869,645,213,696 |
| 74 | 73 | 0 | 0 |
| 75 | 74 | 0 | 0 |
| 76 | 75 | 0 | 0 |
| 77 | 76 | 1 | 75,557,863,725,914,323,419,136 |
| 78 | 77 | 0 | 0 |
| 79 | 78 | 0 | 0 |
| 80 | 79 | 0 | 0 |
| Total | | | 81,402,749,386,839,761,113,321 |

As illustrated above, consecutively adding the bit values of the SDS 300 produces a decimal sum of 8.140274939e22. This means that there are 23 digits in the output number. When this sum is expressed as a whole number, its precise value is: "81,402,749,386,839,761,113,321." To realize a measurable level of data compression, the decimal sum of the 80-bit SDS can be synthesized into an alternate mathematical expression such as: "$121^{11}$" (or "one hundred twenty-one-to-the-eleventh-power"). This numerical expression can then be encoded in a machine-readable KDP written as:

"121^11"

The data needed to encode the mathematical expression "121^11" is only 24 bits (3 bytes). Specifically, the decimal values (121) and (11) can each be encoded within two 8-bit groups because, in the binary system, the total range of decimal values that can be represented in each group is 0 through 255. The ASCII symbol (^) can also be encoded using 1 byte of data.

The above example given with respect to the SDS 300 illustrates the methodology in which the bits of an SDS can be calculated into an equivalent decimal value and further synthesized into an alternate numerical expression which, in the final stage of the SBS scheme, is used as the input data for a source's KDP. In the above SDS-to-KDP demonstration, the decimal sum that resulted from calculating the SDS's bits was precise enough to be synthesized into a single exponential expression of ("121^11") without any collateral decimal remainder. Because there are an infinite number of equivalent numerical values that can be calculated from the analysis of binary data sets, it is a mathematical certainty that not every sum will be without any collateral decimal remainder resulting from such calculation. Therefore, in the following SDS-to-KDP demonstration, we will show how an SDS 400 of FIG. 4 with an "imperfect" decimal sum can be synthesized into a "perfect" KDP (e.g., a KDP that produces the decimal sum exactly) using multiple primers.

When the bits in the SDS 400 are consecutively added together (e.g., such as in the manner described above with respect to the SDS 300 of FIG. 3), the decimal sum that is produced is: "2,432,902,008,176,640,000." When this decimal sum is initially calculated to determine if it can be synthesized into a "neat" high-powered exponential expression of equivalent value, or, in other words, an expression without any collateral decimal remainder, it is found to be numerically "imperfect." Whenever an imperfect source sum is produced, the simplest method of calculating its most-approximate base primer is to subtract a binary magnitude variable that is found to be the closest numerical approximation to the output decimal sum of the SDS. In other words, since the output sum of the SDS 400 is (2.432902008e18), the closest equivalent decimal value that can be expressed as a binary magnitude variable would be ($2^{61}$), which, when calculated, produces a decimal value of (2.305843009e18). In order to calculate the next viable ($2^{nd}$-order) sub-primer, the numerical disparity between the SDS sum and the newly-obtained base primer value must first be ascertained. When these two numbers are calculated by subtracting the base primer value from the sum of the SDS, the remaining decimal value is (1.27058999e17). When this decimal remainder is calculated to determine whether it can be synthesized into a "neat" equivalent expression, its most-approximate equivalent sum is found to produce a mantissa (collateral decimals to the right of a logarithm).

Whenever any sub-primer is found to have a mantissa, the simplest method of determining whether it can be used as a viable output sub-primer, the closest square/cube root of the number is calculated to find the most-approximate non-negative integer with the smallest mantissa (i.e., the lowest number of collateral decimals). In the case of the decimal remainder (1.27058999e17), the most viable sub-primer variable is found by calculating its first cube root ($\sqrt[3]{}$), which produces a decimal value of (502,730.3947). This sub-primer output variable of (502,730.3947 3) can be used as a viable $2^{nd}$-order KDP number, because, when it is calculated into its whole decimal form and compared for accuracy against its source variable, it doesn't produce any collateral decimals. Therefore, the two KDP numbers that can be integrated to produce a perfect output KDP number are detailed as follows:

| | | |
|---|---|---|
| 1. | Precise calculated decimal sum of SDS: | 2,432,902,008,176,640,000 |
| 2. | MINUS base primer binary magnitude value of ($2^{61}$): | 2,305,843,009,213,693,952 |
| 3. | MINUS $2^{nd}$-order sub-primer value of ($502,730.3947^3$): | 127,058,998,962,946,048 |
| | Decimal Remainder (if any): ZERO | |

In the final analysis, the "perfect" multi-variable KDP for the SDS 400 may be expressed as follows:

"2^61+502730.3947^3"

When this multi-variable output KDP number is calculated into a single whole number, it produces a decimal value of (2,432,902,008,176,640,000), which is precisely equivalent to the calculated decimal sum of the SDS 400. The data needed to encode the mathematical expression "2^61+502730.3947^3" as a perfect KDP number is 73 bits (less than 10 bytes). These 73 bits are broken down as follows:

2 bits to represent the base decimal number (2)

8 bits to represent the ASCII symbol (^) to signify an exponential-power 6 bits to represent the exponential-power decimal magnitude of (61)

8 bits to represent the ASCII symbol (+) to signify an addition mathematical operation 19 bits to represent the whole decimal number (502,730)

8 bits to represent the ASCII symbol (.) to signify a decimal point (or a period)

12 bits to represent the decimal magnitude of the mantissa (3947)

8 bits to represent the ASCII symbol (^) to signify an exponential-power 2 bits to represent the exponential-power decimal magnitude of (3)

The 73 total bits of data needed to express the above perfect KDP can be encoded within 10 bytes because, at 8-bits-per-byte, the maximum data capacity of 10 bytes is 80 bits. In terms of data compression, encoding the binary information contained in an 8-byte SDS into a 10-byte multi-variable KDP number would mathematically indicate a negative net output compression ratio of 0.80:1, which is the net compression yield of 8 bytes increased to 10 bytes (0.0097 KB).

This particular example of a multi-primer KDP is being included herein to demonstrate that it is, in fact, mathematically-possible to produce a negative net compression yield from the application of the SBS scheme to an arbitrary-length SDS. Although it is highly unlikely that an SDS as small as 8 bytes would have any viable human utility beyond machine-readable-only command prompts and predetermined programming functions, an 8-byte SDS was specifically chosen because it approximates the algorithmic/substitution threshold limit that determines whether a positive or negative output compression yield is produced by the application of the SBS scheme. It is important to emphasize the fact that, as prior algorithm examples demonstrate, the SBS scheme uses multi-input data fields to encode an SDS into an output KDP whose range of unique numerical input data are virtually limitless. Whenever the application of the SBS scheme produces a negative net compression yield, it is mathematically-possible to synthesize other multi-primer alternative variables that can produce more precise decimal sums which, upon further calculation, can have a material effect on whether the final KDP synthesis yields a positive or negative net compression ratio.

Experimental Results and Discussions

The algorithm structure of the SBS-KDP scheme uses dual binary input data fields to encode up to 64 bits (8 bytes) of scalable KDP source information per field. The precise range of numerical values that be encoded within each 64-bit "number field" is 0 through 18,446,744,073,709,551,615 (18 Quintillion, or $2^{64}-1$), which is used to represent the corresponding range of decimal values produced by calculating the bits of a source data set ("SDS"). The two number fields are functionally partitioned by a third input data "character field" used to represent dynamic mathematical functions such as exponential-powers ($x^\wedge$), square and cube roots ($\sqrt{x}$) ($\sqrt[3]{x}$), factorials (x!), or any other math operation (+, −, ÷, *, etc.), for instance.

When both input number fields are coded to represent the maximum decimal value of their 64-bit data capacities used in tandem with the input character field to express a dynamic mathematical operation, a high-powered exponential value, for example, the combined tri-field input would be:

"18446744073709551615^18446744073709551615"

The data needed to represent this specific maximum-value KDP number is only 136 bits (17 bytes), whereas the amount of source data that can be encoded is 2.3 sextillion bytes (2.3 Zettabytes, or "ZB") with 100.000% lossless data retention efficiency. If no other extrinsic SBS-KDP file data are needed to produce a perfect ICDP source number, then these 17-byte-scheme metrics would mathematically indicate an output compression ratio of 138 EB:0.017 KB, which is the net compression yield of a 2.3 ZB SDS reduced to 17 bytes (0.017 KB).

As previously explained, whenever any extrinsic SBS-KDP file data are embedded into a perfect KDP source number, the output size of the KDP could increase from its 17-byte "Quantum Footprint" to its maximum scalable payload capacity of 32 bytes (0.032 KB). Including any such extrinsic KDP file data would necessarily decrease the output compression ratio from 139 EB:0.017 KB to 73 EB:0.031 KB, which is the net compression yield of a 2.3 ZB SDS reduced to 17 bytes and 32 bytes, respectively.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B. Additionally, use of the term "based on" should not be interpreted as "only based on" or "based only on." Rather, a first element being "based on" a second element includes instances in which the first element is based on the second element alone or on the second element and one or more additional elements.

The subject matter of the present disclosure is described with specificity herein to meet statutory requirements. However, the description itself is not intended to limit the scope of this disclosure. Rather, the inventor has contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method of data compression comprising:
   obtaining a binary source data set;
   determining a decimal value that represents the source data set;
   determining a Kinetic Data Primer (KDP) that represents the decimal value, the KDP including a mathematical expression that represents the decimal value; and
   storing the KDP as a compressed version of the source data set.

2. The method of claim 1, wherein the decimal value includes a summation that is determined based on binary values of individual bits included in the source data set.

3. The method of claim 2, wherein bits having binary values of "0" are given respective decimal bit values of "0" with respect to determining the summation.

4. The method of claim 2, wherein bits having binary values of "1" are given respective decimal bit values with respect to determining the summation that are based on placement of such bits in the binary source data set.

5. The method of claim 2, wherein:
   the source data set includes "N" bits with bit placement values from "0" to "N-1"; and
   a value used in the summation for an "nth" bit of the source data with a placement value of "n-1" is "$2^{n-1}$".

6. The method of claim 4, wherein the value used in the summation for the "nth" bit is "$2^{n-1}$" in response to the "nth" bit being a binary "1".

7. The method of claim 1, wherein the KDP includes one or more representations of one or more mathematical operators.

8. The method of claim 7, wherein the one or more mathematical operators include one or more of: an addition symbol, a subtraction symbol, an exponent symbol, a division symbol, a multiplication symbol, a parenthesis symbol, a factorial symbol, or a root symbol.

9. The method of claim 1, further comprising:
   obtaining the KDP as the compressed version of the source data set;
   determining the decimal value based on the KDP;
   determining bit values of the source data set based on decimal value; and
   reproducing the source data set based on the determined bit values.

* * * * *